US012754224B2

(12) United States Patent
Maier et al.

(10) Patent No.: US 12,754,224 B2
(45) Date of Patent: Oct. 6, 2026

(54) MONITORING DEVICE FOR A HIGH-VOLTAGE ONBOARD ELECTRICAL SYSTEM, AND METHOD FOR OPERATING A MONITORING DEVICE

(71) Applicants: Mercedes-Benz Group AG, Stuttgart (DE); INFINEON TECHNOLOGIES AG, Neubiberg (DE)

(72) Inventors: Andreas Maier, Uhingen (DE); Peter Maier, Weilheim (DE); Werner Roessler, Neufahrn (DE)

(73) Assignees: Mercedes-Benz Group AG, et al., Stuttgart (DE); Infineon Technologies AG, Neubiberg (DE)

( * ) Notice: Subject to any disclaimer, the term of this patent is extended or adjusted under 35 U.S.C. 154(b) by 194 days.

(21) Appl. No.: 18/702,519

(22) PCT Filed: Sep. 15, 2022

(86) PCT No.: PCT/EP2022/075643
§ 371 (c)(1),
(2) Date: Apr. 18, 2024

(87) PCT Pub. No.: WO2023/066572
PCT Pub. Date: Apr. 27, 2023

(65) Prior Publication Data
US 2024/0410926 A1 Dec. 12, 2024

(30) Foreign Application Priority Data
Oct. 19, 2021 (DE) ..................... 10 2021 127 098.7

(51) Int. Cl.
*G01R 15/20* (2006.01)
*G01R 19/10* (2006.01)
(Continued)

(52) U.S. Cl.
CPC ......... *G01R 31/006* (2013.01); *G01R 15/202* (2013.01); *G01R 19/10* (2013.01); *H02H 7/18* (2013.01)

(58) Field of Classification Search
CPC .... G01R 31/006; G01R 15/202; G01R 19/10; G01R 15/205; G01R 31/52; H02H 7/18;
(Continued)

(56) References Cited

U.S. PATENT DOCUMENTS 6,246,556 B1 * 6/2001 Haun .................. H02H 1/0015 361/42
2009/0085573 A1 * 4/2009 Blakely ................. G01R 31/52 324/509
(Continued)

FOREIGN PATENT DOCUMENTS

DE 102 53 018 A1 5/2004
DE 10 2019 112 839 B3 10/2020
EP 2 384 922 A2 11/2011

OTHER PUBLICATIONS

International Search Report (PCT/ISA/210) issued in PCT Application No. PCT/EP2022/075643 dated Jan. 24, 2023 (2 pages).

*Primary Examiner* — Elim Ortiz
(74) *Attorney, Agent, or Firm* — Crowell & Moring LLP

(57) ABSTRACT

A monitoring device for a high-voltage onboard electrical system of an electrically operable vehicle. The high-voltage onboard electrical system includes a high-voltage energy storage device that is couplable to an electrically positive and an electrically negative charge line. The electrically positive charge line is couplable to a positive electric voltage of a charging device via a charging connection to charge the high-voltage energy storage device and the electrically negative charge line is couplable to a negative electric voltage of the charging device to charge the high voltage energy storage device. The monitoring device has a control unit
(Continued)

with a current sensor which is configured to determine the sum of the electric currents of the positive and the negative charge lines. The control unit is configured to separate the positive and the negative charge lines from the high-voltage onboard electrical system upon detecting a fault.

10 Claims, 2 Drawing Sheets

(51) Int. Cl.
*G01R 31/00* (2006.01)
*H02H 7/18* (2006.01)

(58) Field of Classification Search
CPC .... B60L 2240/549; B60L 3/0069; B60L 3/04; B60L 53/62; Y02T 10/70
See application file for complete search history.

(56) References Cited

U.S. PATENT DOCUMENTS

2011/0273139 A1* 11/2011 Hofheinz ................ B60L 53/11
320/109
2018/0067172 A1 3/2018 Gilman et al.

* cited by examiner

MONITORING DEVICE FOR A HIGH-VOLTAGE ONBOARD ELECTRICAL SYSTEM, AND METHOD FOR OPERATING A MONITORING DEVICE

BACKGROUND AND SUMMARY OF THE INVENTION

The invention relates to a monitoring device for a high-voltage onboard electrical system of an electrically operable vehicle and to a method for operating a monitoring device for a high-voltage onboard electrical system of an electrically operable vehicle.

During the process of charging a high-voltage energy storage device in a high-voltage onboard electrical system of an electrically operable vehicle, very large amounts of energy are converted. In the process, energy flows from the charging infrastructure in the direction of the high-voltage energy storage device. Further high-voltage components, such as the electrical drive train for example, are coupled passively into the high-voltage onboard electrical system.

Double or reinforced insulations are generally used in communication networks in vehicles, or the energy stored in the Y capacitances, which are used for reasons of electromagnetic compatibility (EMC), is limited to a safe value. In addition, insulation monitoring devices are used which can detect the presence of a short circuit through a body. In the case of certain faults in the charging cable of an electrically operable vehicle, at the present time it is only possible to make a reduction in the energy stored in the Y capacitances, because insulation monitoring generally does not have the required reaction speed and there is no standardized requirement for double or reinforced insulation of the charging cable.

DE 10 2019 112 839 B3 discloses a protection and monitoring device that at least comprises: a protective conductor and at least one safety line loop coupled to the protective conductor, a so-called pilot line, wherein the at least one safety line loop comprises at least a first integrated circuit, a second integrated circuit and a number of switching elements.

The switching elements are each coupled to at least one monitoring device or monitoring unit that monitors at least one electrical component of the charging infrastructure. The first integrated circuit is configured to establish a cycle of a current flowing through the safety line loop and/or a voltage to be applied to the safety line loop and also to individually identify a switching state of a respective switching element. The second integrated circuit is configured to check the cycle specified by the first integrated circuit. During operation of the charging infrastructure, an input of current via the first integrated circuit passes a current through the safety line loop. If, for at least one monitoring unit, a safety-critical break in operating data of the electrical components monitored by the monitoring unit is identified, the switching element coupled to the monitoring unit is opened, the safety line loop is interrupted and, as a result of this, the charging infrastructure is discharged.

One objective of the invention is to provide an improved monitoring device for a high-voltage onboard electrical system of an electrically operable vehicle.

A further objective is to specify a method for operating such an improved monitoring device for a high-voltage onboard electrical system of an electrically operable vehicle.

According to one aspect of the invention, a monitoring device for a high-voltage onboard electrical system of an electrically operable vehicle is provided, wherein the high-voltage onboard electrical system at least comprises a high-voltage energy storage device, which can be coupled to an electrically positive and an electrically negative charge line, the electrically positive charge line, which can be coupled to a positive electric voltage of a charging device via a charging connection in order to charge the high-voltage energy storage device, and the electrically negative charge line, which can be coupled to a negative electric voltage of the charging device via the charging connection in order to charge the high-voltage energy storage device.

In this case, the monitoring device has a control unit with at least one current sensor that is designed to determine a sum of the electric currents of the positive charge line and of the negative charge line. The control unit is designed to separate the positive charge line and the negative charge line from the high-voltage onboard electrical system upon detection of a fault.

If, for example, in the event of a fault, current flows through a body on account of an insulation fault or if there is some other type of short to ground or to the other of the two charge lines, the monitoring device according to the invention can be used to cause the charging current to be switched off before the flow of current through the body reaches critical values. For this purpose, the sum of the currents of the positive and negative charge lines is determined, wherein the currents have different signs, since they flow in opposite directions. In the further embodiments, the term sum of the currents refers in each case to this sum of the currents of the positive and negative charge lines. This can take place, for example, using a Hall sensor, for example using a so-called open-loop Hall sensor, which determines the current by measuring the magnetic field. If a fault is detected via this path, the charge lines are interrupted by unidirectional semiconductor switches, for example. In this case, detection of the fault can be based on a current integral, for example, which is set to zero upon each change of the current direction and the absolute value of which is compared to a threshold value. The values of the current integral can, if required, also be filtered in order to compensate for offset errors in the sum of the currents.

Any hazard owing to contacting of the conductor in the charging path can therefore be prevented independently of the energy content of vehicle-side Y capacitances.

In addition, external short circuits can be limited to melting integral values of less than 500 000 $A^2s$ by the semiconductor switches which are present. This value of 500 000 $A^2s$ is required in the charging interface standard CHAdeMO, for example, and describes the additional use whereby, in the case of short-circuit events in the charging device, the specific amount of heat that can be drawn from the battery is limited in order to protect the charging device. This is usually achieved by fuses. The use of a fuse with such a low trip threshold, however, frequently limits the possible charging current in nominal operation, because otherwise the requirements for durability cannot be met.

According to an advantageous configuration of the monitoring device, the at least one current sensor can be designed to determine the sum of the currents via a common magnetic field of the positive and the negative charge line.

Current sensors that come into consideration are all sensors which can ascertain a sum of the currents, such as Hall sensors for example, or magnetoresistive sensors. Advantageously, the sum of the currents can be measured via the common magnetic field of both charge lines.

According to an advantageous configuration of the monitoring device, the at least one current sensor can be designed as at least one of a Hall sensor, in particular an open-loop Hall sensor, a magnetoresistive sensor and a transformer.

Current sensors that come into consideration are sensors which can ascertain a sum of the currents. In this way, the sum of the currents can be measured via the common magnetic field of both charge lines. For example, a Hall sensor with a magnetic field concentrator in accordance with the so-called open-loop Hall effect can be used. A Hall sensor such as this measures the magnetic field in the air gap of a magnetic toroidal core which has current flowing through it, and can determine the current therefrom. Alternatively, the magnetic field can also be measured with a magnetoresistive sensor. A further possibility is to use a transformer, and in this way to only consider the alternating-current portion, which can then be filtered, for example.

According to an advantageous configuration of the monitoring device, a switching element, in particular a semiconductor switch, can be arranged in the positive and negative charge line in each case, in order to separate the positive charge line and the negative charge line from the high-voltage onboard electrical system upon detection of the fault.

Field-effect transistors (FETs) can be used advantageously as the semiconductor switch. For example, SiC-FETs, GaN-FETs or even normal Si-FETs can be used in this way.

According to an advantageous configuration of the monitoring device, the control unit can be designed to infer the detection of the fault from a temporal profile of the current integral of the sum of the electric currents.

The detection of the fault can be based on a current integral, for example, which is set to zero upon each change of the current direction and the absolute value of which is compared to a threshold value. The values of the current integral can also be filtered, if required, in order to compensate for offset errors in the sum of the currents.

According to a further aspect of the invention, a method is provided for operating a monitoring device for a high-voltage onboard electrical system of an electrically operable vehicle, wherein the high-voltage onboard electrical system at least comprises a high-voltage energy storage device, which can be coupled to an electrically positive and an electrically negative charge line, the electrically positive charge line, which can be coupled to a positive electric voltage of a charging device via a charging connection in order to charge the high-voltage energy storage device, and the electrically negative charge line, which can be coupled to a negative electric voltage of the charging device via the charging connection in order to charge the high-voltage energy storage device.

The monitoring device has a control unit with at least one current sensor. In this case, a sum of the electric currents of the positive charge line and of the negative charge line is determined by means of the current sensor. The positive charge line and the negative charge line are separated from the high-voltage onboard electrical system when the control unit detects a fault.

According to the method according to the invention, the monitoring device can be used to switch off the charging current before a flow of current through the body reaches critical values. For this purpose, the sum of the currents of the positive and negative charge lines, that is to say the sum of the current of the positive charge line and of the current of the negative charge line, is determined. This can take place, for example, using a Hall sensor, for example using a so-called open-loop Hall sensor, which determines the current by measuring the magnetic field.

If a fault is detected via this path, the charge lines are interrupted by unidirectional semiconductor switches, for example. In this case, detection of the fault can be based on a current integral, for example, which is set to zero upon each change of the current direction and the absolute value of which is compared to a threshold value. The values of the current integral can, if required, also be filtered in order to compensate for offset errors in the sum of the currents.

A hazard owing to contacting of the conductor in the charging path can therefore be prevented independently of the energy content of vehicle-side Y capacitances.

According to an advantageous configuration of the method, the fault can be inferred from a temporal profile of a current integral of the sum of the electric currents. A temporal change of the current integral of the sum of the electric currents makes it possible to detect that the electrical path on which the charging current should actually flow has changed. This can indicate an insulation fault or a short circuit through a body, which means that a fault can be detected promptly and the charge lines can be separated from the high-voltage onboard electrical system.

According to an advantageous configuration of the method, a value of the current integral can be set to zero upon each change of the current direction of the sum of the electric currents. This makes it possible to reliably detect a possible fault.

According to an advantageous configuration of the method, the fault can be inferred from a comparison of an absolute value of the current integral to a prescribed threshold value. The comparison to a prescribed threshold value ensures that the number of states erroneously detected as being faults can be minimized by the monitoring device.

According to an advantageous configuration of the method, the current integral can be filtered in order to compensate for an offset error during determination of the sum of the electric currents. In this way, it can be ensured that fault detection is not impaired by artifacts during determination of the current integral.

Further advantages emerge from the following description of the drawings. An exemplary embodiment of the invention is depicted in the drawings. The drawings, the description, and the claims contain numerous features in combination. A person skilled in the art will also expediently consider the features individually and combine them to form useful further combinations.

DETAILED DESCRIPTION OF THE DRAWINGS

In the figures, identical or similar components are denoted by identical reference signs. The figures merely show examples and are not to be understood as being limiting.

Figure 1:
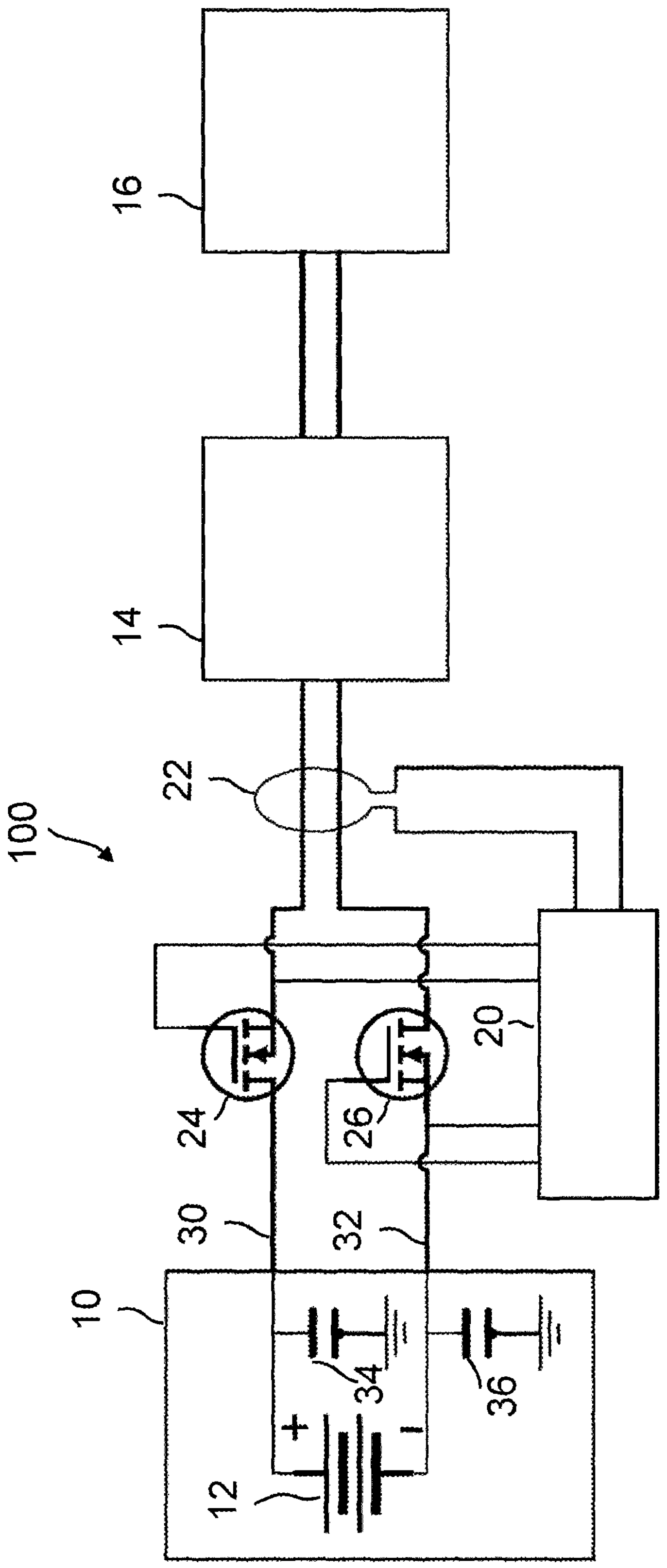
FIG. 1 shows a system overview of a high-voltage onboard electrical system of an electrically operable vehicle, which electrical system is connected to a charging device, with a monitoring device according to an exemplary embodiment of the invention.
Figure 2:
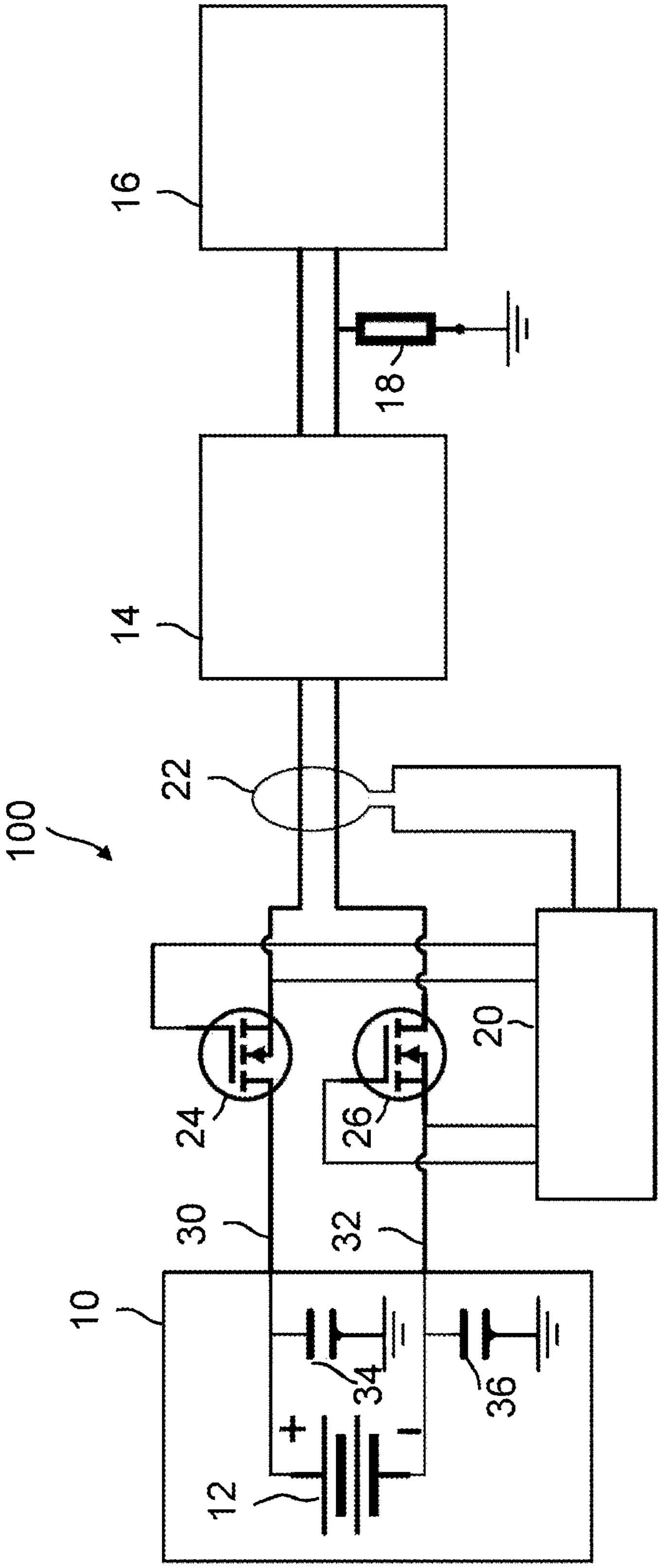
FIG. 2 shows the high-voltage onboard electrical system connected to the charging device as per FIG. 1 with a short circuit through a body of the negative charge line via a fault resistance to ground.

FIG. 1 shows a system overview of a high-voltage onboard electrical system 10 of an electrically operable vehicle, which electrical system is connected to a charging device 16, with a monitoring device 100 according to an exemplary embodiment of the invention. FIG. 2 shows the high-voltage onboard electrical system 10 connected to the charging device 16 as per FIG. 1 with a short circuit through a body of the negative charge line 32 via a fault resistance 18 to ground.

The high-voltage onboard electrical system 100 comprises a high-voltage energy storage device 12, which is coupled to an electrically positive and an electrically negative charge line 30, 32, and the electrically positive charge line 30 and the electrically negative charge line 32, which are connected to a positive and negative electric voltage, respectively, of a charging device 16 via a charging connection 14 in order to charge the high-voltage energy storage device 12. The two charge lines 30, 32 are connected to ground via Y capacitances 34, 36 within the high-voltage onboard electrical system 10 in order to ensure the electromagnetic compatibility (EMC) of the high-voltage onboard electrical system 10.

The monitoring device 100, which has a control unit 20 with a current sensor 22, is arranged between the high-voltage onboard electrical system 10 and the charging connection 14.

The current sensor 22 is designed to determine a sum of the electric currents of the positive charge line 30 and of the negative charge line 32. The current sensor 22 can preferably be designed to determine the sum of the currents via a common magnetic field of the positive and the negative charge line 30, 32. For this purpose, the current sensor 22 can be designed as a Hall sensor, for example, in particular as a so-called open-loop Hall sensor. Alternatively, the magnetic field can also be measured with a magnetoresistive sensor. A further possibility is to use a transformer, and in this way to only consider the alternating-current portion, which can then be filtered, for example.

In the positive and negative charge line 30, 32, a switching element 24, 26, in particular a semiconductor switch 24, 26, is arranged in each case, which can be controlled by the control unit 20. In this way, the positive charge line 30 and the negative charge line 32 can be separated from the high-voltage onboard electrical system 10 upon detection of a fault.

Field-effect transistors (FETs) can be used advantageously as semiconductor switches 24, 26. For example, SiC-FETs, GaN-FETs or even normal Si-FETs can be used in this way.

According to the method according to the invention, the monitoring device 100 can be used to switch off the charging current before a flow of current through a body reaches critical values. For this purpose, the sum of the currents of the positive and negative charge lines 30, 32, that is to say the sum of the positively directed current of the positive charge line 30 and of the negatively directed current of the negative charge line 32, is determined. The sum of the currents is determined with the current sensor 22.

If a fault is detected via this path, the two charge lines 30, 32 are interrupted by the unidirectional semiconductor switches 24, 26. In this case, detection of the fault can be based on a current integral, for example, which is set to zero upon each change of the current direction and the absolute value of which is compared to a threshold value.

The values of the current integral can also be filtered, if required, in order to compensate for offset errors in the sum of the currents. The fault can thus be inferred from a temporal profile of a current integral of the sum of the electric currents.

A hazard owing to contacting of the conductor in the charging path can therefore be prevented independently of the energy content of vehicle-side Y capacitances 34, 36.

If a fault resistance 18 occurs, as can be seen in the example depicted in FIG. 2, between one of the charge lines 30, 32 and ground, for example as a result of a short circuit through a body, this changes the current integral registered with the current sensor 22 and the control unit 20. The control unit 20 can subsequently open the two semiconductor switches 24, 26, so that the charge lines 30, 32 are separated from the high-voltage onboard electrical system 10.

In this way, a possible hazard as a result of the short circuit through a body, which is identified via the fault resistance 18, can be avoided. Thanks to the short switching time of the semiconductor switches 24, 26, the contacts of the charge lines 30, 32 can be opened promptly.

LIST OF REFERENCE CHARACTERS

10 High-voltage onboard electrical system
12 High-voltage energy storage device
14 Charging connection
16 Charging device
18 Fault resistance
20 Control unit
22 Current sensor
24 Switching element
26 Switching element
30 Positive charge line
32 Negative charge line
34 Y capacitance
36 Y capacitance
100 Monitoring device

The invention claimed is:

1. A monitoring device for a high-voltage onboard electrical system of an electrically operable vehicle, the monitoring device comprising:

a current sensor configured to:

determine a sum of: an electric current of an electrically positive charge line, and an electric current of an electrically negative charge line, wherein the electrically positive charge line is configured to couple a high-voltage energy storage device of the onboard electrical system to a charging connection that is in turn connected to a positive electric voltage of a charging device so as to charge the high-voltage energy storage device, and wherein the electrically negative charge line is configured to couple the high-voltage energy storage device to the charging connection that is in turn connected to a negative electric voltage of the charging device so as to charge the high-voltage energy storage device;

a control unit configured to:

detect a fault based on the determined sum, and separate the electrically positive charge line and the electrically negative charge line from the high-voltage onboard electrical system upon detection of the fault.

2. The monitoring device of claim 1, wherein the current sensor is configured to determine the sum via a common magnetic field of the electrically positive charge line and of the electrically negative charge line.

3. The monitoring device of claim 1, wherein the current sensor is an open-loop Hall sensor or a magnetoresistive sensor or a transformer.

4. The monitoring device of claim 1, further comprising:

a first switching element and a second switching element disposed respectively in the electrically positive charge line and the electrically negative charge line, wherein the electrically positive charge line and the electrically negative charge line are separable from the high-voltage onboard electrical system by the first switching element and the second switching element upon the detection of the fault.

5. The monitoring device of claim 1, wherein the control unit is configured to infer the detection of the fault from a temporal profile of a current integral of the sum.

6. A method for operating the monitoring device of claim 1, comprising:

determining the sum of the respective electric currents of the electrically positive charge line and of the electrically negative charge line by the current sensor; and separating the electrically positive charge line and the electrically negative charge line from the high-voltage onboard electrical system when the control unit detects the fault.

7. The method of claim 6, wherein the fault is inferred from a temporal profile of a current integral of the sum.

8. The method of claim 7, wherein a value of the current integral is set to zero upon each change of a current direction of the sum.

9. The method of claim 7, wherein the fault is inferred from a comparison of an absolute value of the current integral to a prescribed threshold value.

10. The method of 7, wherein the current integral is filtered in order to compensate for an offset error during the determining.

* * * * *